(12) United States Patent
Yamakita et al.

(10) Patent No.: US 11,985,773 B2
(45) Date of Patent: May 14, 2024

(54) DISPLAY DEVICE

(71) Applicant: JOLED INC., Tokyo (JP)

(72) Inventors: Hiroyuki Yamakita, Tokyo (JP); Teruo Nanmoku, Tokyo (JP); Masaki Kawasaki, Tokyo (JP); Tetsuro Nakamura, Tokyo (JP); Shunsuke Itakura, Tokyo (JP)

(73) Assignee: JOLED INC., Tokyo (JP)

( * ) Notice: Subject to any disclaimer, the term of this patent is extended or adjusted under 35 U.S.C. 154(b) by 82 days.

(21) Appl. No.: 17/822,684

(22) Filed: Aug. 26, 2022

(65) Prior Publication Data
US 2023/0061015 A1 Mar. 2, 2023

(30) Foreign Application Priority Data
Aug. 31, 2021 (JP) ................... 2021-141473

(51) Int. Cl.
*H05K 5/02* (2006.01)
*H05K 7/20* (2006.01)

(52) U.S. Cl.
CPC .......... *H05K 5/02* (2013.01); *H05K 7/20963* (2013.01)

(58) Field of Classification Search
CPC ............................ H05K 5/02; H05K 7/20963
See application file for complete search history.

(56) References Cited

U.S. PATENT DOCUMENTS 9,291,853 B2 * 3/2016 Maruno ............... G02B 6/0088
2008/0261057 A1 10/2008 Slobodin
2012/0033364 A1 2/2012 Nonaka
2012/0051022 A1 3/2012 Dong et al.
2017/0357124 A1 * 12/2017 Tanaka ............... G02F 1/133308

FOREIGN PATENT DOCUMENTS

| JP | 2006030321 A | 2/2006 | |
| JP | 2006113606 A | 4/2006 | |
| JP | 2012037672 A | 2/2012 | |
| JP | 2012054929 A | 3/2012 | |
| JP | 2014160281 A * | 9/2014 | ............... G09F 9/00 |
| JP | 2014160281 A | 9/2014 | |
| JP | 6267665 B2 | 1/2018 | |
| JP | 3224923 U | 1/2020 | |
| JP | 2021004959 A | 1/2021 | |

OTHER PUBLICATIONS

English translation of JP 2014160281 A (Year: 2014).*

* cited by examiner

*Primary Examiner* — Mukundbhai G Patel
(74) *Attorney, Agent, or Firm* — CHIP LAW GROUP

(57) ABSTRACT

Disclosed herein is a display device including a display panel having a display portion configured to display an image, a plate-shaped member having a first principal surface and a second principal surface, the display panel being disposed on a second principal surface side, the plate-shaped member including a screen portion disposed in a position corresponding to the display portion, an opaque frame member disposed at a peripheral edge of the screen portion, a bonding member that has transparency and is configured to bond the display panel and the plate-shaped member to each other, a holding member disposed on the second principal surface side of the plate-shaped member, and a fixing member configured to fix the frame member and the holding member to the plate-shaped member, the plate-shaped member further including a transparent peripheral edge portion disposed on an outside of the frame member.

13 Claims, 16 Drawing Sheets

DISPLAY DEVICE

CROSS REFERENCE

The present disclosure contains subject matter related to that disclosed in Japanese Priority Patent Application JP 2021-141473 filed in the Japan Patent Office on Aug. 31, 2021, the entire content of which is hereby incorporated by reference.

BACKGROUND

The present disclosure relates to a display device.

Display devices which use a flat display panel such as a liquid crystal display panel or an organic electro-luminescence (EL) display panel are known. In such a display device, a display panel and a front panel (plate-shaped member) disposed on a front side of the display panel are fixed by use of a bezel (see Japanese Patent Laid-Open No. 2014-160281 (hereinafter, referred to as Patent Document 1)). The bezel is an opaque frame-shaped member disposed on the periphery of the display device.

SUMMARY

There have been proposed display devices in which a frame-shaped transparent portion is disposed on the periphery of a display portion of the display panel and a floating effect is thereby produced such that an image displayed on the display panel appears to be floating in the air.

A configuration in which, for example, the display panel and the plate-shaped member are laminated to each other by a bonding member such as an optical adhesive sheet (optical clear adhesive (OCA)) in such a display device has been studied. However, the display device of such a configuration can cause a display defect such as peeling-off of the display panel and the plate-shaped member from each other or cracking of the display panel due to stress at a time of application of a load to a peripheral portion of the display device. In addition, disposition of a bezel as in Patent Document 1 on the periphery of the display device having such a configuration is also possible, but impairs the floating effect.

Thus, with the existing technology, it is difficult to realize a display device that can suppress the occurrence of a display defect without impairing the floating effect.

Accordingly, the present disclosure provides, as a display device providing the floating effect, a display device that can suppress the occurrence of a display defect without impairing the floating effect.

A display device according to one aspect of the present disclosure includes a display panel having a display portion configured to display an image, a plate-shaped member having a first principal surface and a second principal surface, the display panel being disposed on a second principal surface side, the plate-shaped member including a screen portion disposed in a position corresponding to the display portion, an opaque frame member disposed at a peripheral edge of the screen portion, a bonding member that has transparency and is configured to bond the display panel and the plate-shaped member to each other, a holding member disposed on the second principal surface side of the plate-shaped member, and a fixing member configured to fix the frame member and the holding member to the plate-shaped member. The plate-shaped member further includes a transparent peripheral edge portion disposed on an outside of the frame member.

According to one aspect of the present disclosure, it is possible to realize, as a display device providing the floating effect, a display device that can suppress the occurrence of a display defect without impairing the floating effect.

DETAILED DESCRIPTION OF THE PREFERRED EMBODIMENTS

Figure 1:
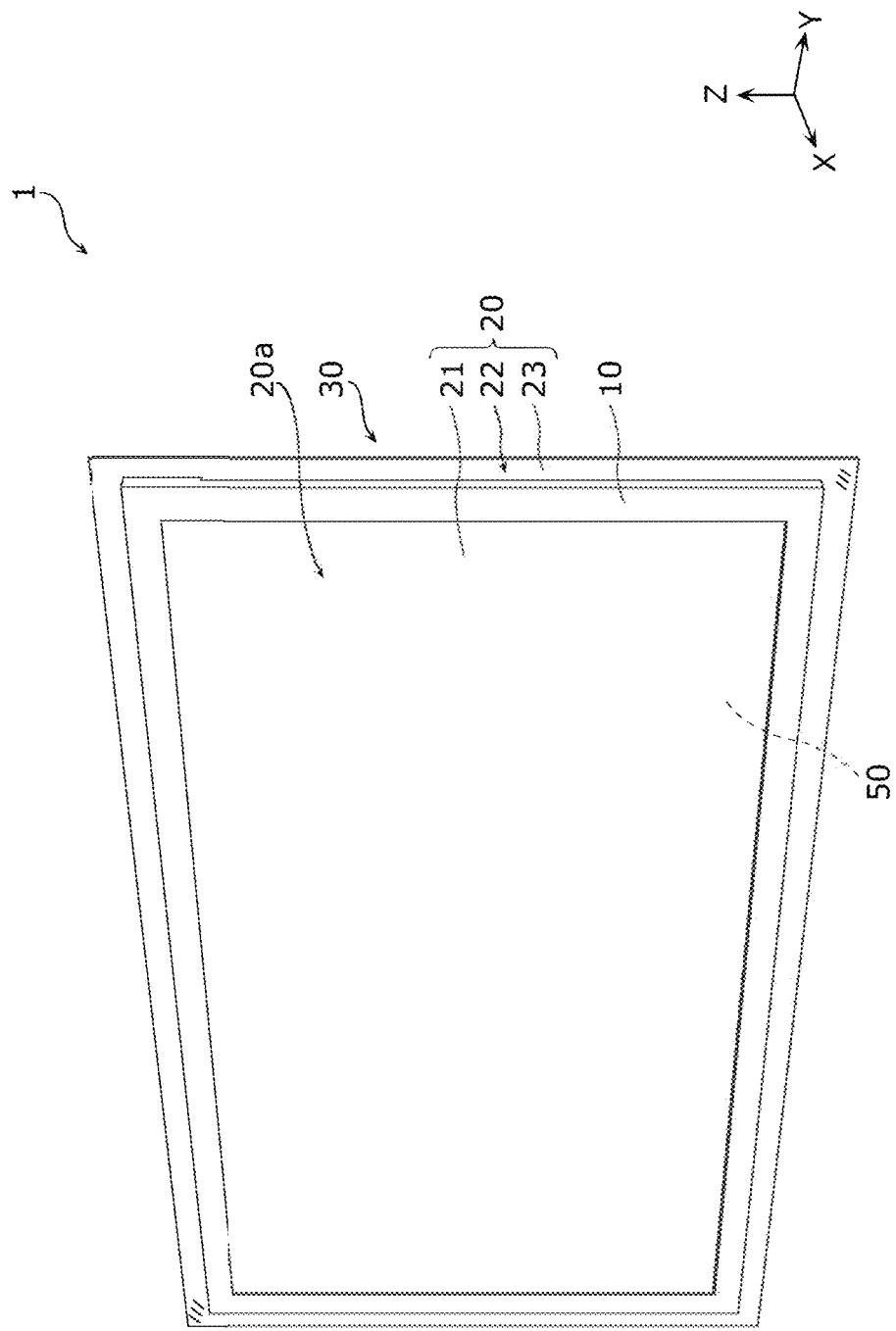
FIG. 1 is a perspective view depicting an external appearance of a display device according to an embodiment.

Embodiments will hereinafter be described concretely with reference to the drawings.

It is to be noted that the embodiments to be described in the following each represent a comprehensive or concrete example. Numerical values, shapes, constituent elements, the arrangement positions and connection forms of the constituent elements, for example, illustrated in the following embodiments are an example, and are not intended to limit the present disclosure. For example, of the constituent elements in the following embodiments, constituent elements not described in independent claims are described as optional constituent elements.

In addition, each diagram is a schematic diagram, and is not necessarily precisely illustrated. Hence, for example, scales in respective diagrams and other details do not necessarily coincide with each other. In addition, in each diagram, substantially identical configurations are identified by the same reference numerals, and repeated description thereof will be omitted or simplified.

In addition, in the present specification and the drawings, an X-axis, a Y-axis, and a Z-axis represent three axes of a right-handed three-dimensional rectangular coordinate system. In the embodiments, an X-axis direction is set as a laminating direction of constituent elements of a display device, a Y-axis direction is set as a long side direction of the display device having a rectangular shape, and a Z-axis direction is set as a short side direction of the display device having a rectangular shape. A direction perpendicular to the X-axis direction and the Y-axis direction is set as the Z-axis direction. In addition, in the present specification, "as viewed from the front" means viewing the display device along the laminating direction of the display device (which laminating direction is also a thickness direction of the display device, and is the X-axis direction).

In addition, in the present specification, terms indicating relations between elements, such as being equal to each other, and terms indicating the shapes of elements, such as a rectangular shape and an elliptic shape, as well as numerical values and numerical ranges are not expressions indicating only strict meanings, but are expressions meaning including also substantially similar ranges, for example, differences of approximately a few percent (for example, approximately 10%).

In addition, in the present specification, a display defect refers to a display defect that can be caused by stress that occurs when a load is applied to a peripheral portion of the display device, and illustrates, for example, peeling-off of a display panel and a plate-shaped member from each other, cracking of the display panel, or other display defects. In addition, a display defect may be display nonuniformity caused by a nonuniform thickness of the display panel or other display defects.

EMBODIMENT

A display device according to a present embodiment will hereinafter be described with reference to FIGS. 1 to 14.

1. Configuration of Display Device

Figure 2:
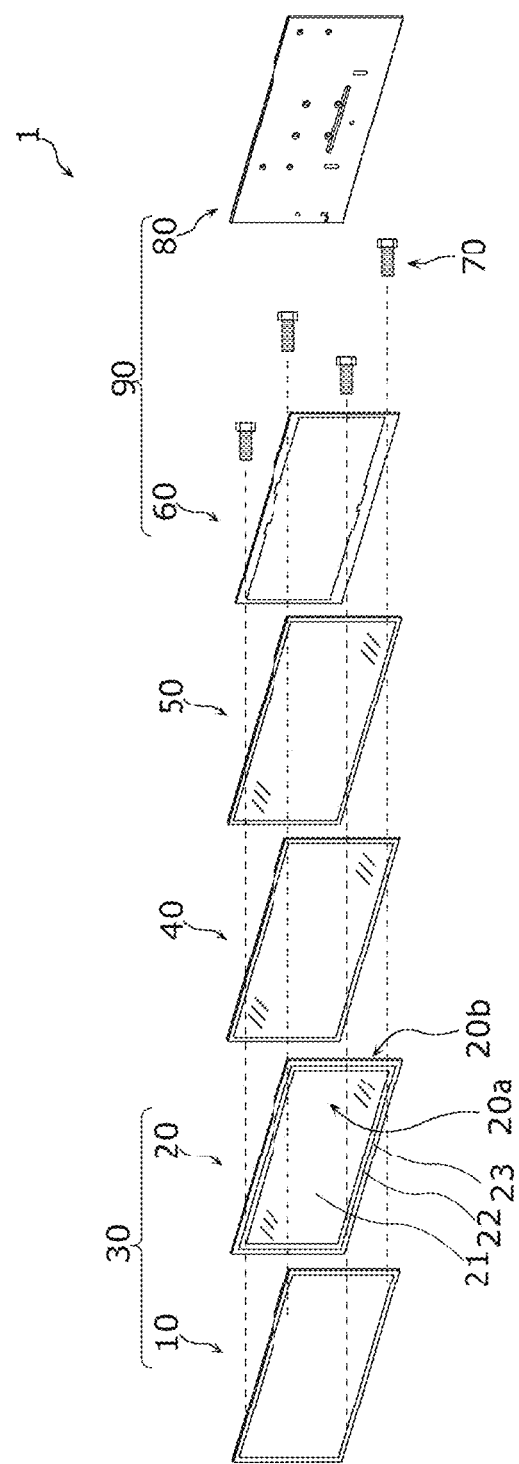
FIG. 2 is an exploded perspective view depicting a configuration of the display device according to the embodiment.

A configuration of the display device according to the present embodiment will first be described with reference to FIGS. 1 to 8C. FIG. 1 is a perspective view depicting an external appearance of a display device 1 according to the present embodiment. FIG. 2 is an exploded perspective view depicting a configuration of the display device 1 according to the present embodiment.

The display device 1 according to the present embodiment is a device that displays an image. As depicted in FIG. 1 and FIG. 2, the display device 1 includes a front panel 30, a bonding member 40, a display panel 50, screws 70, and a holding member 90.

The front panel 30 is a plate-shaped member having a first principal surface 20a and a second principal surface 20b located on a back side of the first principal surface 20a, the display panel 50 being disposed on the second principal surface 20b side. The display panel 50 is disposed along the second principal surface 20b.

The front panel 30 includes a frame member 10 and a plate-shaped member 20. The display device 1 has a configuration that suppresses, by the frame member 10 and the holding member 90, the occurrence of a display defect such as peeling-off of the plate-shaped member 20 and the display panel 50 from each other. Specifically, the display device 1 has a configuration that suppresses, by the frame member 10 and the holding member 90, deformation of the plate-shaped member 20 due to a load. The frame member 10 and the plate-shaped member 20 are separate members, for example.

The frame member 10 is a plate-shaped frame body, and is a member provided with a desired decoration. In the present embodiment, the frame member 10 is also a member for suppressing the occurrence of a display defect in the display device 1. The frame member 10, for example, has higher rigidity than that of the plate-shaped member 20. In addition, the frame member 10 is an opaque member disposed at a peripheral edge of a screen portion 21. The frame member 10 has a lower transmittance than that of the plate-shaped member 20. Incidentally, being opaque means that visible light is not transmitted completely and that visible light is practically not transmitted. In the present specification, a visible light transmittance of less than 10% will be referred to as being opaque. In addition, an opaque region may include a transparent part in microscopic terms.

As viewed from the front, the frame member 10 may have a uniform visible light transmittance, or the visible light transmittance of the frame member 10 may be gradually increased with decreasing distance to the outside of the display device 1 (with decreasing distance to a peripheral edge portion 23 from the screen portion 21).

In the present embodiment, the frame member 10 is housed in a frame-shaped groove 22 formed in the plate-shaped member 20. The frame member 10 can also be said to be embedded in the groove 22. The frame member 10 is disposed between the screen portion 21 and the peripheral edge portion 23 as viewed from the front. For example, the frame member 10 is a plate-shaped frame body surrounding the screen portion 21. The frame member 10 may be disposed in a position corresponding to a bezel portion (not depicted) of the display panel 50. The width in the short side direction (that is, the Z-axis direction) and the width in the long side direction (that is, the Y-axis direction) of the frame member 10 may be respectively substantially equal to the width in the short side direction (that is, the Z-axis direction) and the width in the long side direction (that is, the Y-axis direction) of the bezel portion.

The bezel portion can thereby be hidden by the frame member 10. Hence, it becomes difficult for a user to recognize the bezel portion that is a structure of the display panel 50, so that a floating effect of the display device 1 can be enhanced.

Figure 5:
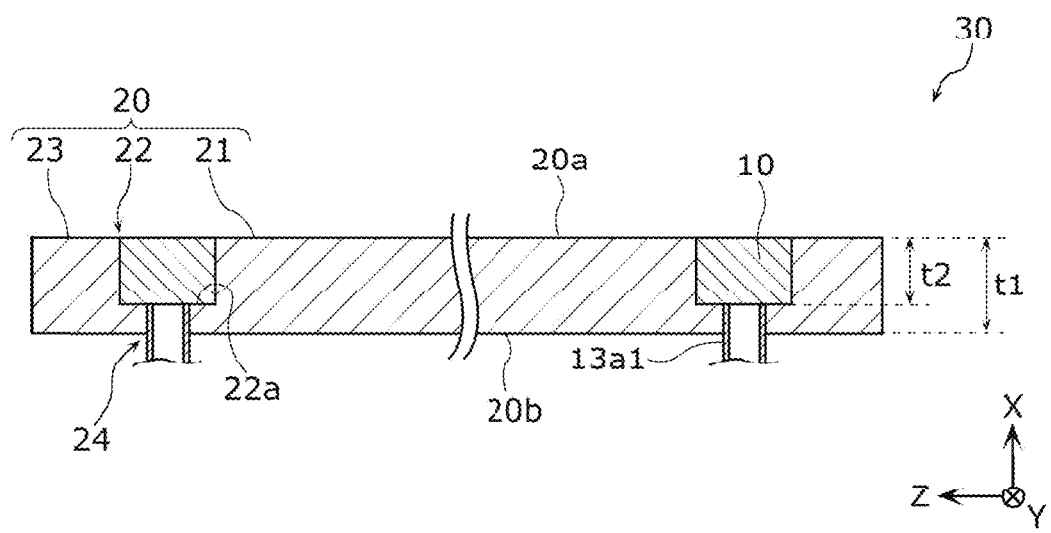
FIG. 5 is a sectional view depicting the front panel sectioned along a cutting line V-V depicted in FIG. 4.

The thickness (that is, a dimension in the X-axis direction, and, for example, a thickness t2 depicted in FIG. 5) of the frame member 10 is approximately 1.6 mm, but is not limited to this.

Figure 3:
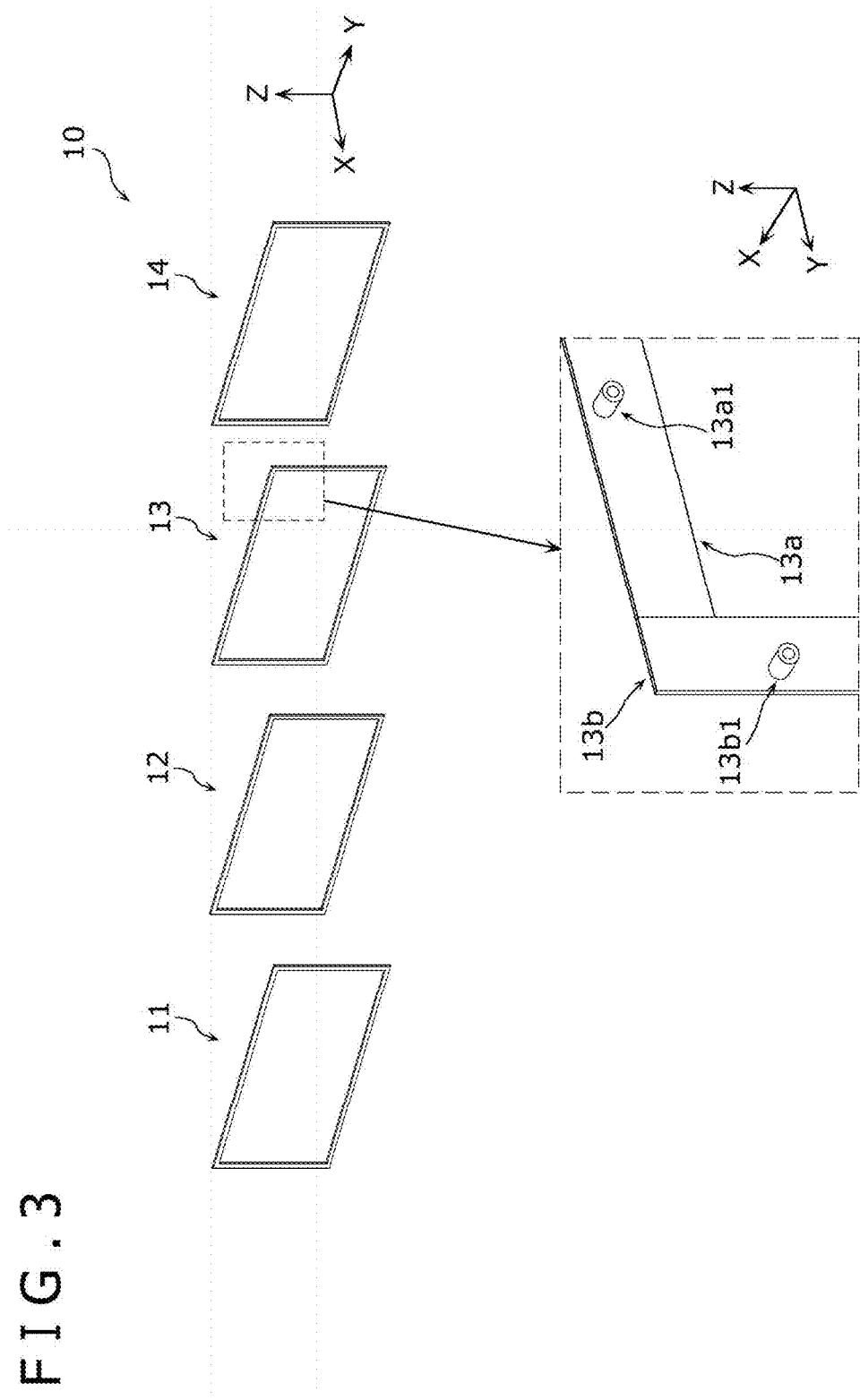
FIG. 3 is an exploded perspective view depicting a configuration of a frame member according to the embodiment.

A configuration of the frame member 10 will be further described in the following with reference to FIG. 3. FIG. 3 is an exploded perspective view depicting a configuration of the frame member 10 according to the present embodiment.

As depicted in FIG. 3, the frame member 10 includes a decorated member 11, a bonding member 12, a boss member 13, and a bonding member 14. The decorated member 11 and the boss member 13 are formed of a metal, for example. The frame member 10, for example, has a laminated structure in which two or more metallic members are laminated.

The decorated member 11 is a plate-shaped frame body disposed closer to the first principal surface 20a side (X-axis positive side) than the boss member 13, and provided with a desired decoration. The decorated member 11 is a member visually recognized by the user in the frame member 10, and functions as a decorative plate. In the present embodiment, the decorated member 11 is formed by a steel use stainless (SUS), but is not limited to this. The decorated member 11 is, for example, formed by a desired coating or other decoration being performed on a surface on the first principal surface 20a side (X-axis positive side) of a frame made of SUS. In the present embodiment, the decorated member 11 is formed by application of a black color coating to a frame made of SUS.

The thickness (that is, a dimension in the X-axis direction) of the decorated member 11 is approximately 0.3 mm, but is not limited to this.

It is to be noted that the decorated member 11 is not limited to being formed of a metal, but may, for example, be formed of a frame-shaped hard plastic or other materials.

The bonding member 12 has a frame shape corresponding to the decorated member 11, and bonds the decorated member 11 and the boss member 13 to each other. The bonding member 12 is, for example, formed of a material that can bond metals to each other. In the present embodiment, an acrylic-based resin adhesive is used as the bonding member 12. However, an adhesive such as a silicone-based resin adhesive may be used as the bonding member 12. In addition, the bonding member 12 may be a double-sided tape. The bonding member 12 is not visually recognized by the user because the bonding member 12 is hidden by the decorated member 11 as viewed from the front.

The thickness (that is, a dimension in the X-axis direction) of the bonding member 12 is approximately 0.2 mm, but is not limited to this.

The boss member 13 is a plate-shaped frame body for fixing the frame member 10 and the holding member 90 (specifically, a peripheral edge fixing member 60) to the plate-shaped member 20 by the screws 70. The whole of the boss member 13 may coincide with the decorated member 11 as viewed from the front. The boss member 13 may have a substantially similar shape as viewed from the front to that of the decorated member 11. The boss member 13 may have a shape coinciding with that of the decorated member 11 as viewed from the front. The boss member 13 is not visually recognized by the user because the boss member 13 is hidden by the decorated member 11 as viewed from the front. In addition, the thickness (that is, a dimension in the X-axis direction) of the boss member 13 is, for example, larger than the thickness of the decorated member 11. The thickness of the boss member 13 is, for example, approximately 0.8 mm, but is not limited to this. Incidentally, the thickness of the boss member 13 is the thickness of first plate-shaped portions 13a and second plate-shaped portions 13b to be described in the following.

The boss member 13 is formed by a pair of first plate-shaped portions 13a having a plate shape elongated in the long side direction (that is, the Y-axis direction) and a pair of second plate-shaped portions 13b having a plate shape elongated in the short side direction (that is, the Z-axis direction). The first plate-shaped portions 13a and the second plate-shaped portions 13b are formed integrally, but may be separate members.

The first plate-shaped portions 13a have, on a surface thereof on the second principal surface 20b side (X-axis negative side), a first boss portion 13a1 in a projecting shape that projects to the second principal surface 20b side. The second plate-shaped portions 13b have, on a surface thereof on the second principal surface 20b side (X-axis negative side), a second boss portion 13b1 in a projecting shape that projects to the second principal surface 20b side. A threaded hole for screwing by a screw 70 is formed in each of the first boss portions 13a1 and the second boss portions 13b1. Each of the first boss portions 13a1 and the second boss portions 13b1 is provided in such a position as to coincide with the decorated member 11 as viewed from the front. The screws 70 can thereby be prevented from being visually recognized by the user as viewed from the front.

The number of first boss portions 13a1 and second boss portions 13b1 is not particularly limited to any number, and it suffices to provide two or more boss portions for one side, for example.

The boss member 13 may have higher rigidity than that of the plate-shaped member 20. In addition, the boss member 13 may, for example, have higher rigidity than that of the decorated member 11. In the present embodiment, the boss member 13 is formed of SECC steel (electrogalvanized steel), but is not limited to this.

It is to be noted that the boss member 13 is not limited to being formed of a metal, but may, for example, be formed of a frame-shaped hard plastic or other materials.

The bonding member 14 has a frame shape corresponding to the decorated member 11, and bonds the boss member 13 and the plate-shaped member 20 (specifically, a frame-shaped bottom surface (see a bottom surface 22a depicted in FIG. 5) forming the groove 22 of the plate-shaped member 20) to each other. The bonding member 14 is, for example, formed of a material capable of bonding a metal and a resin or glass to each other. In the present embodiment, an acrylic-based resin adhesive is used as the bonding member 14. However, an adhesive such as a silicone-based resin adhesive may be used as the bonding member 14. In addition, the bonding member 14 may be a double-sided tape. The bonding member 14 is not visually recognized by the user because the bonding member 14 is hidden by the decorated member 11 as viewed from the front.

The thickness (that is, a dimension in the X-axis direction) of the bonding member 14 is approximately 0.3 mm, but is not limited to this.

Referring to FIG. 1 and FIG. 2 again, the plate-shaped member 20 is a plate-shaped member that is disposed in the front surface (for example, the foremost surface) of the display device 1 and that has transparency. The plate-shaped member 20 is provided to produce a floating effect such that an image displayed on the display panel 50 appears to be floating in the air. In the present embodiment, the plate-shaped member 20 has a rectangular shape. The thickness (that is, a dimension in the X-axis direction, and, for example, a thickness t1 depicted in FIG. 5) of the plate-shaped member 20 is approximately 2.5 mm, but is not limited to this. Further, the plate-shaped member 20 has rigidity. In addition, the plate-shaped member 20 is larger than the display panel 50 as viewed from the front. Incidentally, in the present specification, having transparency refers to having a visible light transmittance of 10% or more, for example.

The plate-shaped member 20 is formed of a resin having transparency. The plate-shaped member 20 is, for example, formed of a transparent resin. In the present embodiment, a transparent polycarbonate plate is used as the plate-shaped member 20. The plate-shaped member 20 is a transparent plate. Here, being transparent means not only being completely transparent, that is, having a visible light transmittance of 100%, but also being substantially transparent. In the present specification, having a visible light transmittance of 90% or more will be referred to as being transparent.

The plate-shaped member 20 has the screen portion 21 and the peripheral edge portion 23. In addition, the plate-shaped member 20 has the frame-shaped groove 22 formed between the screen portion 21 and the peripheral edge portion 23 as viewed from the front. The screen portion 21 and the peripheral edge portion 23 are formed integrally with each other.

The screen portion 21 is a part that has transparency, is disposed in such a position as to face the display panel 50, and covers the whole of the display panel 50 (for example, a display portion of the display panel 50). In the present embodiment, the screen portion 21 is realized as a part of a transparent polycarbonate plate. Because the screen portion 21 is transparent as described above, an image displayed on the display panel 50 can be viewed from the outside of the display device 1. In addition, a part from the screen portion 21 to the peripheral edge portion 23 can be made flat as compared with a case where the screen portion 21 is formed by, for example, a through hole formed in the plate-shaped member 20. Thus, the user does not easily recognize a boundary between the screen portion 21 and the peripheral edge portion 23. The floating effect of the display device 1 can therefore be enhanced.

The groove 22 is a frame-shaped recess surrounding the screen portion 21 as viewed from the front. The frame member 10 is embedded in the groove 22. The size of the groove 22 corresponds to the size of the frame member 10. For example, the width (that is, a dimension in the Y-axis direction or the Z-axis direction) and the depth (that is, a dimension in the X-axis direction) of the groove 22 are dimensions corresponding to the corresponding dimensions of the frame member 10. The groove 22 is formed in the first principal surface 20a of the plate-shaped member 20.

Incidentally, the groove 22 may be formed by processing such as laser processing being performed on the plate-shaped member 20 in a flat plate shape, or may be formed such that the plate-shaped member 20 has the groove 22 at a time of molding of the plate-shaped member 20 (for example, at a time of resin molding).

The peripheral edge portion 23 is a part that has transparency and that is disposed on the outside of the frame member 10 as viewed from the front. The peripheral edge portion 23 surrounds the periphery of the display panel 50 as viewed from the front. The peripheral edge portion 23 is, for example, a transparent part. Because the display device 1 has the transparent peripheral edge portion 23 on the outside of the screen portion 21, the user easily recognizes an image displayed on the display panel 50 as if the image were floating in the air. That is, the display device 1 can provide the floating effect. Incidentally, as viewed from the front, the peripheral edge portion 23 does not coincide with the display panel 50. In addition, the peripheral edge portion 23 can, for example, be directly touched by the user.

The area of the peripheral edge portion 23 is not particularly limited to any area, but may, for example, be twice the area of the frame member 10 or more. A distance from an end portion of the display panel 50 to an end portion of the peripheral edge portion 23 can thereby be increased. That is, a distance from an image displayed on the display panel 50 to the end portion of the plate-shaped member 20 can be increased. Thus, when the user views the image, the user does not easily recognize the end portion of the plate-shaped member 20. It is therefore possible to suppress a reduction in the floating effect which reduction is attendant on recognition of the end portion of the plate-shaped member 20 by the user. The area of the peripheral edge portion 23 may be three times the area of the frame member 10 or more. It is thereby possible to further suppress the reduction in the floating effect which reduction is attendant on recognition of the end portion of the plate-shaped member 20 by the user.

The width of the peripheral edge portion 23 is not particularly limited to any width. Incidentally, while the width of the peripheral edge portion 23 is fixed in the present embodiment, the width of the peripheral edge portion 23 may be changed according to position. Further, a minimum width of the peripheral edge portion 23 may be twice a maximum width of the frame member 10 or more. It is thereby possible to suppress the reduction in the floating effect which reduction is attendant on recognition of the end portion of the plate-shaped member 20 by the user. In addition, the minimum width of the peripheral edge portion 23 may be three times the maximum width of the frame member 10 or more. It is thereby possible to further suppress the reduction in the floating effect. Moreover, a minimum width of the frame member 10 may be 10% or more of the length in the long side direction of the display panel 50. It is thereby possible to suppress the reduction in the floating effect which reduction is attendant on recognition of the end portion of the plate-shaped member 20 by the user.

Incidentally, no opaque member is disposed on the outside of the peripheral edge portion 23 of the plate-shaped member 20. It is thereby possible to suppress the reduction in the floating effect which reduction is attendant on recognition of the end portion of the plate-shaped member 20 by the user.

Incidentally, the plate-shaped member 20 may have a hard coat layer on a front surface thereof. The hard coat layer may, for example, be an acrylic-based hard coat layer. In the present embodiment, the plate-shaped member 20 includes a base material formed of polycarbonate and the hard coat layer formed on the front surface of the base material. The hard coat layer is, for example, provided to the first principal surface 20a side (X-axis positive side) of the base material, but is not limited to this. The flame resistance (flame retardancy) of the display device 1 can be improved by the hard coat layer being provided.

Figure 4:
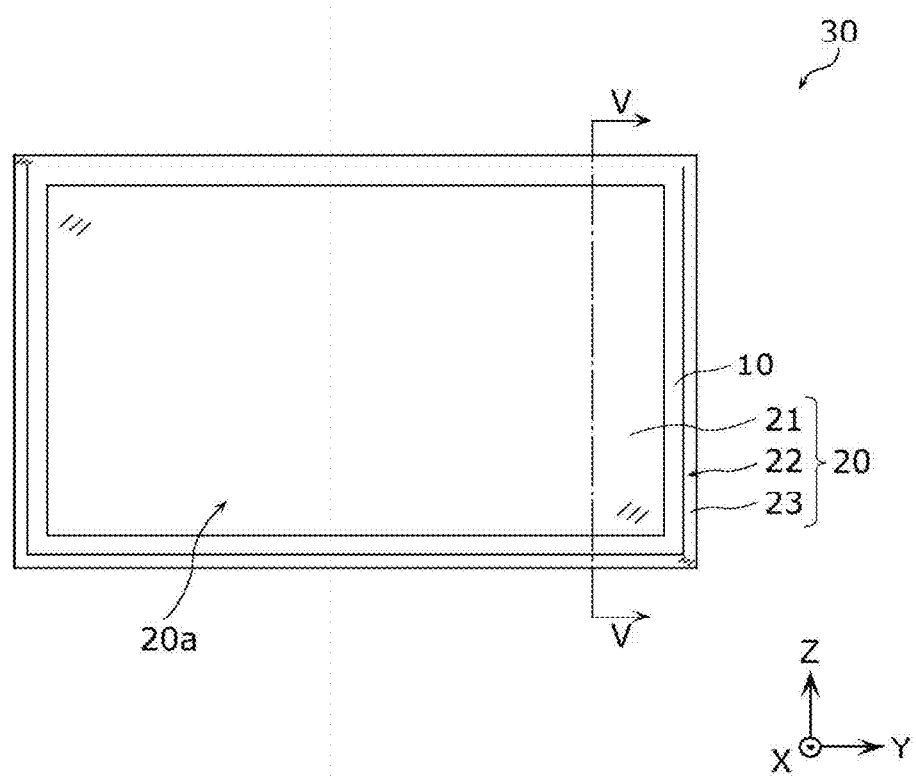
FIG. 4 is a front view depicting a front panel according to the embodiment.

Here, a configuration of the front panel 30, that is, a configuration of the plate-shaped member 20 housing the frame member 10 in the groove 22 will be described with reference to FIG. 4 and FIG. 5. FIG. 4 is a front view depicting the front panel 30 according to the present embodiment. FIG. 5 is a sectional view depicting the front panel 30 sectioned along a cutting line V-V depicted in FIG. 4. The cutting line V-V is a cutting line passing through the first boss portions 13a1 formed on the first plate-shaped portions 13a as viewed from the front.

As depicted in FIG. 4, in a state in which the frame member 10 is housed in the groove 22, the first boss portions 13a1 and the second boss portions 13b1 are not visually recognized. In addition, because the peripheral edge portion 23 is transparent, the rear side of the display device 1 can be visually recognized through the peripheral edge portion 23.

As depicted in FIG. 5, the frame member 10 housed in the groove 22 abuts against the bottom surface 22a forming the groove 22. The groove 22 does not penetrate the plate-shaped member 20 in a thickness direction. The groove 22 has a depth (that is, a dimension in the X-axis direction) equal to the thickness t2 of the frame member 10. That is, the surface on the first principal surface 20a side (X-axis positive side) of the frame member 10 is flush with the first principal surface 20a in a state in which the frame member 10 is housed in the groove 22. The front panel 30 is provided such that the foremost surface (surface on the X-axis positive side) of the decorated member 11 and the foremost surface of the plate-shaped member 20 (that is, the first principal surface 20a) form a same flat surface. In other words, the front panel 30 is provided such that the surfaces on the X-axis positive side of the screen portion 21, the decorated member 11, and the peripheral edge portion 23 form a same flat surface. It can also be said that the surface on the first principal surface 20a side (surface on the X-axis positive side) of the front panel 30 becomes a flat surface by the screen portion 21, the frame member 10, and the peripheral edge portion 23. Incidentally, the thickness t2 is a total thickness of the decorated member 11, the bonding member 12, the boss member 13, and the bonding member 14.

The bottom surface 22a constitutes the surface on a front side (X-axis positive side) of the plate-shaped member 20. That is, the bottom surface 22a is a part of the first principal surface 20a. Contact between the bottom surface 22a and the frame member 10 is an example of contact between the first principal surface 20a and the frame member 10.

A through hole 24 through which a first boss portion 13a1 is inserted is formed at a position of the bottom surface 22a which position corresponds to the first boss portion 13a1. The through hole 24 penetrates the plate-shaped member 20 in the thickness direction. The through hole 24 is provided in such a position as to coincide with the frame member 10 as viewed from the front. In addition, a through hole 24 through which a second boss portion 13b1 is inserted is formed at a position of the bottom surface 22a which position corresponds to the second boss portion 13b1. The first boss portions 13a1 and the second boss portions 13b1 are each provided with a through hole 24.

Referring to FIG. 1 and FIG. 2 again, the bonding member 40 has transparency, and bonds the plate-shaped member 20 and the display panel 50 to each other. The bonding member 40 may be disposed on the whole of contact surfaces of the plate-shaped member 20 and the display panel 50, or may be disposed on only a part of the contact surfaces. Usable as the bonding member 40 is an optical adhesive sheet (OCA), an optical adhesive (optical clear resin (OCR)), a double-sided tape, for example. In the present embodiment, an OCA is used as the bonding member 40. Specifically, in the present embodiment, an acid-free OCA is used as the bonding member 40. The occurrence of outgassing at a time of a high temperature load can be suppressed by using the acid-free OCA. The acid-free OCA is, for example, an OCA not containing a material corroding metallic wiring or the like (for example, a monomer containing an acidic group). Incidentally, it is not essential for the OCA to be acid-free.

Incidentally, the plate-shaped member 20 and the display panel 50 may be bonded to each other by another bonding member. For example, the plate-shaped member 20 and the display panel 50 may be bonded to each other by using transparent screws or the like.

Figure 6:
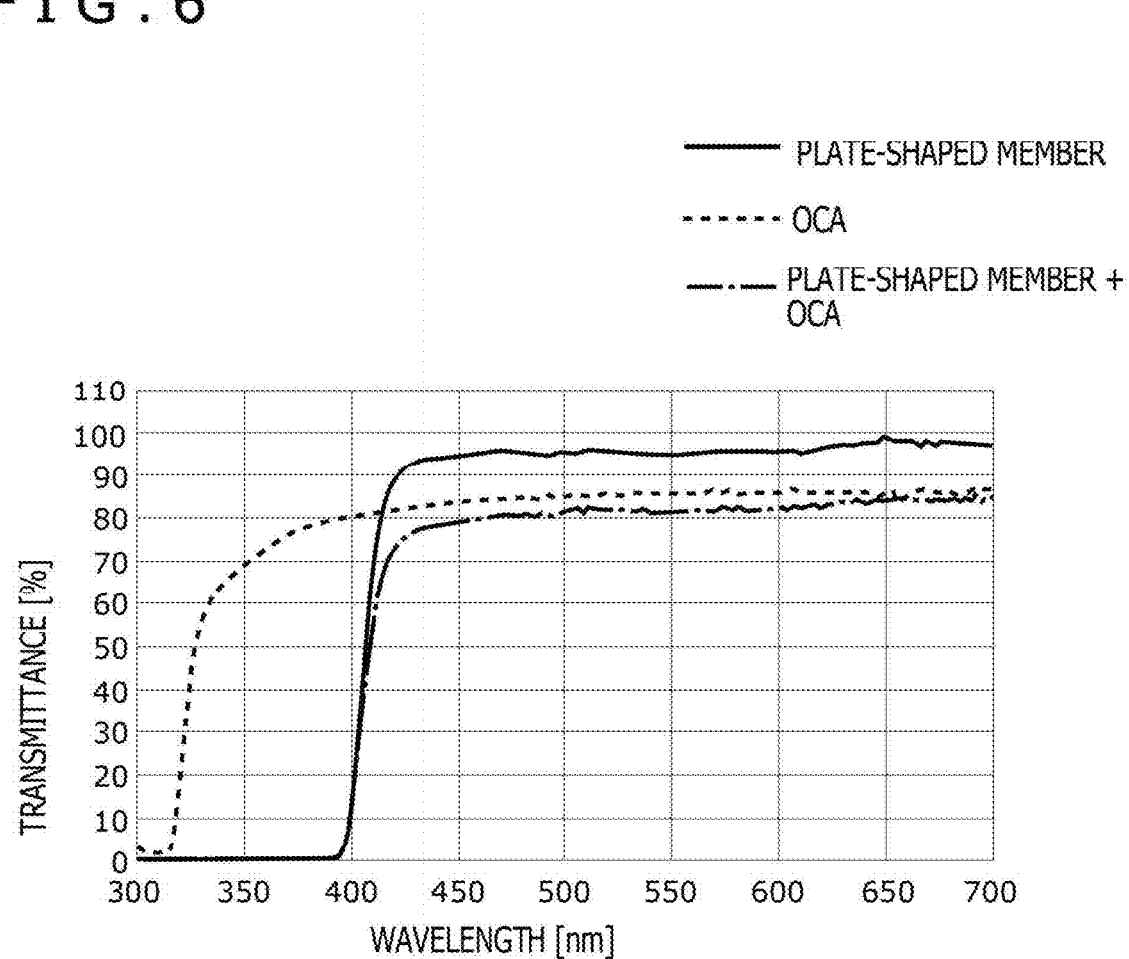
FIG. 6 is a diagram depicting spectral transmittance of a bonding member according to the embodiment.

Here, optical characteristics of the bonding member 40 will be described with reference to FIG. 6. FIG. 6 is a diagram depicting spectral transmittance of the bonding member 40 according to the present embodiment. FIG. 6 also illustrates spectral characteristics of the plate-shaped member 20 and the plate-shaped member 20 to which the bonding member 40 is affixed (PLATE-SHAPED MEMBER+OCA in FIG. 6). An axis of ordinates in FIG. 6 indicates transmittance, and an axis of abscissas in FIG. 6 indicates the wavelength of light.

As depicted in FIG. 6, the bonding member 40 has a higher transmittance for light in a low wavelength region (for example, a region of approximately 415 nm and lower) than that of the plate-shaped member 20. For example, the transmittance of the plate-shaped member 20 is 10% or less at wavelengths of 380 nm and less, whereas the transmittance of the bonding member 40 is higher than 10% even at wavelengths of 380 nm and less. In addition, the bonding member 40 has a lower transmittance for light in a high wavelength region (for example, a region higher than approximately 415 nm) than that of the plate-shaped member 20. For example, the transmittance of the plate-shaped member 20 is 90% or more at wavelengths of 450 nm and more, whereas the transmittance of the bonding member 40 is 80% or more at wavelengths of 450 nm and more.

It is to be noted that the spectral transmittance depicted in FIG. 6 is an example, and is not limited to this.

Referring to FIG. 1 and FIG. 2 again, the display panel 50 is a flat display panel that displays an image. In the present embodiment, the display panel 50 is an organic EL display panel. Such use of an organic EL display panel excellent for black display as the display panel 50 can improve the floating effect of the display device 1 particularly when an image with a black background is displayed.

The display panel 50 is, for example, constituted by a plurality of pixels arranged two-dimensionally. The display panel 50 includes a display portion as a part that displays an image in the display panel 50 and a bezel portion (not depicted) that is disposed on the periphery of the display portion and that does not display an image. In addition, the display panel 50, for example, further includes a circuit board (for example, a printed board 110 depicted in FIG. 8B, to be described later, and other drawings) mounted with a control circuit for controlling the display panel 50, a driving circuit (not depicted) for driving the display portion, a flexible wiring board (for example, a flexible printed circuit (FPC) 100 depicted in FIG. 8B, to be described later, and other drawings) for connecting the circuit board and the driving circuit to each other, and other components.

The shape of the display panel 50 is, for example, a rectangular shape, but is not limited to this. The shape of the display panel 50 may be an elliptic shape or other shapes.

The display panel 50 has rigidity. In addition, the display panel 50 does not coincide with the peripheral edge portion 23 as viewed from the front, for example. In addition, the display panel 50 is, for example, sandwiched between the plate-shaped member 20 and the holding member 90.

The screws 70 are fastening members for fixing the frame member 10 to the holding member 90. In the present embodiment, the screws 70 fix the frame member 10 and the holding member 90 (specifically, the peripheral edge fixing member 60) to the plate-shaped member 20. The screws 70 fix the frame member 10 and the holding member 90 to the plate-shaped member 20 by being screwed into the first boss portions 13a1 and the second boss portions 13b1. Each of the plurality of screws 70 is provided in such a position as to coincide with the frame member 10 as viewed from the front. The screws 70 are an example of a fixing member.

Incidentally, while FIG. 2 illustrates four screws 70, the number of screws 70 is not particularly limited to any number as long as the screws 70 can fix the frame member 10 and the holding member 90. In addition, the fixing member is not limited to the screws 70, and it suffices for the fixing member to be a member that is provided in such a position as to coincide with the frame member 10 as viewed from the front and that is capable of fixing the frame member 10 and the holding member 90. The fixing member may, for example, be a pin or the like, or may be a bonding member. The bonding member for fixing the frame member 10 and the holding member 90 may, for example, have higher adhesive strength than that of the bonding member 40.

The holding member 90 is a member for suppressing the occurrence of a display defect such as peeling-off of the plate-shaped member 20 and the display panel 50 from each other, by being fixed to the plate-shaped member 20 together with the frame member 10 via the screws 70. For example, by fixing the frame member 10 and the holding member 90 to the plate-shaped member 20 by the screws 70, it is possible to reduce stress applied to the plate-shaped member 20 when a load is applied to a peripheral portion of the display device 1. The holding member 90 is disposed on the second principal surface 20b side (X-axis negative side) of the plate-shaped member 20. The holding member 90 may, for example, fix the display panel 50 by a surface on a side opposite to the plate-shaped member 20 (surface on the X-axis positive side in the holding member 90). Further, the holding member 90, for example, has higher rigidity than that of the plate-shaped member 20. In addition, the holding member 90 may, for example, be disposed in such a position as not to coincide with the peripheral edge portion 23 as viewed from the front.

The holding member 90 includes the peripheral edge fixing member 60 and a heat radiating member 80. Incidentally, it suffices for the holding member 90 to include at least the peripheral edge fixing member 60. In addition, in the present embodiment, the peripheral edge fixing member 60 and the heat radiating member 80 are separate members.

The peripheral edge fixing member 60 is a member for suppressing the occurrence of a display defect in the display device 1. The peripheral edge fixing member 60, for example, reduces stress applied to the plate-shaped member 20. That is, the peripheral edge fixing member 60 suppresses deformation of the plate-shaped member 20 due to stress. The peripheral edge fixing member 60, for example, has higher rigidity than that of the plate-shaped member 20. The peripheral edge fixing member 60 is an opaque member disposed at a peripheral edge of the screen portion 21 as viewed from the front.

The peripheral edge fixing member 60 is a plate-shaped frame body. The peripheral edge fixing member 60 is provided such that at least a part of the peripheral edge fixing member 60 coincides with the frame member 10 as viewed from the front. In the present embodiment, the whole of the peripheral edge fixing member 60 coincides with the frame member 10 as viewed from the front. The peripheral edge fixing member 60 may have a substantially identical shape as viewed from the front to that of the frame member 10. The width in the short side direction (that is, the Z-axis direction) and the width in the long side direction (that is, the Y-axis direction) of the peripheral edge fixing member 60 may be respectively substantially equal to the width in the short side direction (that is, the Z-axis direction) and the width in the long side direction (that is, the Y-axis direction) of the frame member 10 (for example, the boss member 13). For example, the peripheral edge fixing member 60 is not visually recognized by the user because the peripheral edge fixing member 60 is hidden by the frame member 10 as viewed from the front. In addition, the peripheral edge fixing member 60 does not coincide with the peripheral edge portion 23 as viewed from the front. The peripheral edge fixing member 60 is an example of a frame member.

The peripheral edge fixing member 60 can be consequently hidden by the frame member 10. Hence, it is difficult for the user to recognize the peripheral edge fixing member 60, so that the floating effect of the display device 1 can be enhanced.

In the peripheral edge fixing member 60, a through hole (not depicted) through which a screw 70 can be inserted is formed at a position corresponding to each of the first boss portions 13a1 and the second boss portions 13b1 of the boss member 13 as viewed from the front.

The heat radiating member 80 is a member for radiating heat generated by the display panel 50. The heat radiating member 80 is provided on the second principal surface 20b side (X-axis negative side) of the display panel 50. The heat radiating member 80 is, for example, a plate-shaped member. The heat radiating member 80 may be disposed such that at least a part of the heat radiating member 80 is in contact with the surface (back surface) on the second principal surface 20b side of the display panel 50, or the heat radiating member 80 may be disposed in such a manner as to be separated from the back surface, that is, with an air layer interposed therebetween. The heat radiating member 80 is, for example, disposed in such a manner as to face the display panel 50.

In the present embodiment, each of the peripheral edge fixing member 60 and the heat radiating member 80 is formed of a metal (or an alloy). The peripheral edge fixing member 60 and the heat radiating member 80 are, for example, formed of metals different from each other. For example, the peripheral edge fixing member 60 is formed of a metal having higher rigidity than that of the heat radiating member 80, and the heat radiating member 80 is formed of a metal having higher heat radiating performance than that of the peripheral edge fixing member 60. In the present embodiment, the peripheral edge fixing member 60 is formed of SECC steel (electrogalvanized steel). However, the peripheral edge fixing member 60 is not limited to this. The peripheral edge fixing member 60 may, for example, be formed of the same metal as the boss member 13. In addition, the heat radiating member 80 is formed of an aluminum alloy, but is not limited to this. The heat radiating member 80 may be formed of a magnesium alloy, or may be formed of a metallic simple substance.

It is to be noted that each of the peripheral edge fixing member 60 and the heat radiating member 80 is not limited to being formed of a metal (or an alloy). The peripheral edge fixing member 60 may, for example, be formed of a frame-shaped hard plastic or other materials. In addition, the heat radiating member 80 may be formed of a thermally conductive resin.

In a state in which the frame member 10 and the holding member 90 are fixed to each other by the screws 70, a part of the plate-shaped member 20 is present between the frame member 10 and the holding member 90. The frame member 10, the plate-shaped member 20, and the holding member 90 are fixed integrally with each other by the screws 70. In other words, the frame member 10 and the holding member 90 are not in contact with each other. Thus, in the display device 1 according to the present embodiment, when the frame member 10 and the holding member 90 are fixed to each other, the frame member 10 and the holding member 90 are fixed to each other via the plate-shaped member 20 as a transparent member. In addition, the plate-shaped member 20 may be in contact with each of the frame member 10 and the holding member 90.

Figure 7:
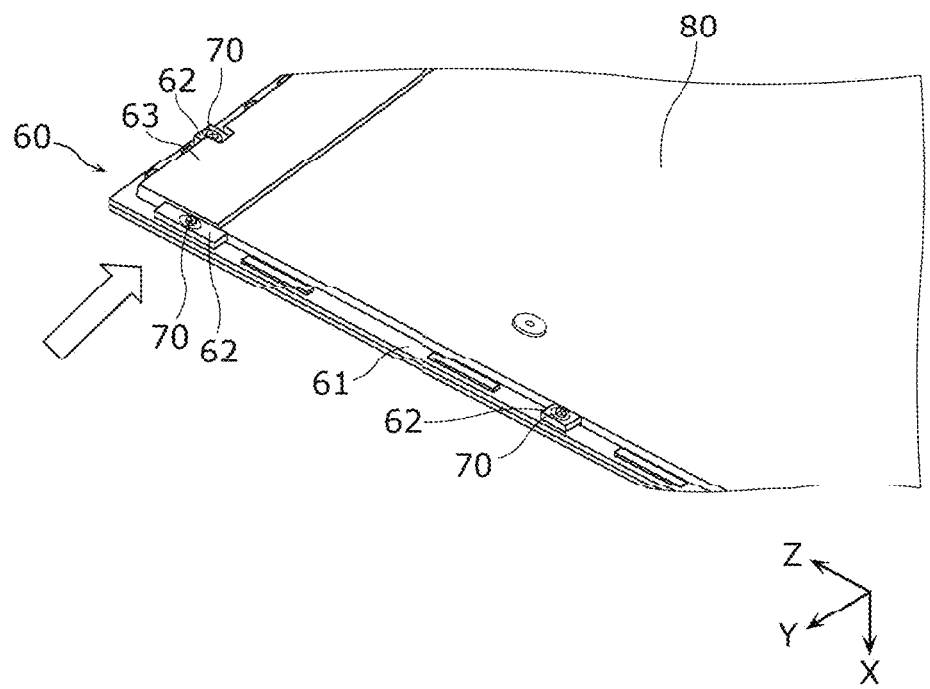
FIG. 7 is a fragmentary perspective view depicting a configuration on a back side of the display device according to the embodiment.

Here, a configuration of the holding member 90 will be further described with reference to FIG. 7. FIG. 7 is a fragmentary perspective view depicting a configuration on the back side of the display device 1 according to the present embodiment.

As depicted in FIG. 7, the screws 70 are screwed to the boss member 13 such that heads of the screws 70 are on the second principal surface 20b side (X-axis negative side). In addition, the peripheral edge fixing member 60 is provided to a peripheral edge of the heat radiating member 80 as viewed from the front.

The peripheral edge fixing member 60 includes a plate-shaped portion 61, first thick portions 62, and a second thick portion 63. The plate-shaped portion 61, the first thick portions 62, and the second thick portion 63 are, for example, formed integrally with each other, but are not limited to this.

The plate-shaped portion 61 is a plate-shaped frame body.

The first thick portions 62 are respectively formed at positions at which the screws 70 are provided as viewed from the front, and are formed to enhance the strength of parts where the screws 70 are provided. The first thick portions 62 are thick parts protruding from the plate-shaped portion 61 to the second principal surface 20b side (X-axis negative side). The first thick portions 62, for example, have a rectangular parallelepipedic shape, but is not limited to this. The first thick portions 62 are provided in such a manner as to be separated from each other. Through holes formed in the peripheral edge fixing member 60 to insert the screws 70 penetrate the plate-shaped portion 61 and the first thick portions 62.

The second thick portion 63 is a plate-shaped part extending along the long side direction of the peripheral edge fixing member 60. In the present embodiment, the second thick portion 63 extends in the Y-axis direction. The second thick portion 63 is provided in such a position as not to coincide with the first thick portions 62 as viewed from the front, and, for example, has a larger thickness than that of the first thick portions 62. Strength on the long-side side of the peripheral edge fixing member 60 can be enhanced by the second thick portion 63 being provided.

As for the strength of the peripheral edge fixing member 60, the strength of screwed parts is considered to be dominant. Therefore, stress on the plate-shaped member 20 can be reduced effectively by enhancing the strength of the screwed parts. In the display device 1, the strength of the peripheral edge fixing member 60 can be enhanced effectively by the first thick portions 62 being provided. In addition, the peripheral edge fixing member 60 can be reduced in weight because parts having a small effect on the strength have a small thickness.

Figure 8A:
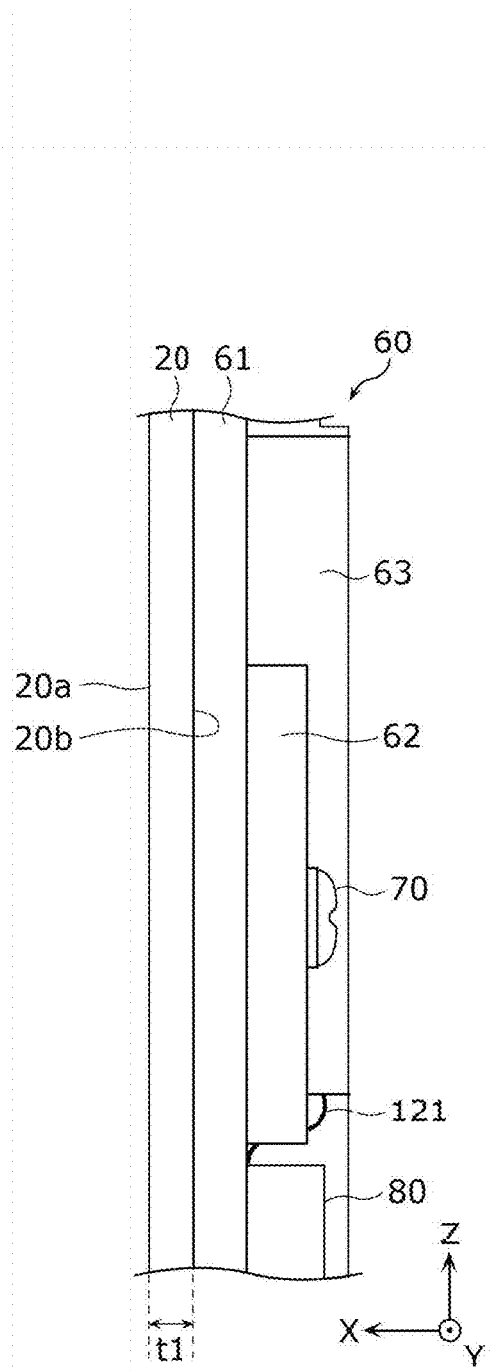
FIG. 8A is a diagram depicting a configuration of the display device according to the embodiment as viewed from a side.
Figure 8B:
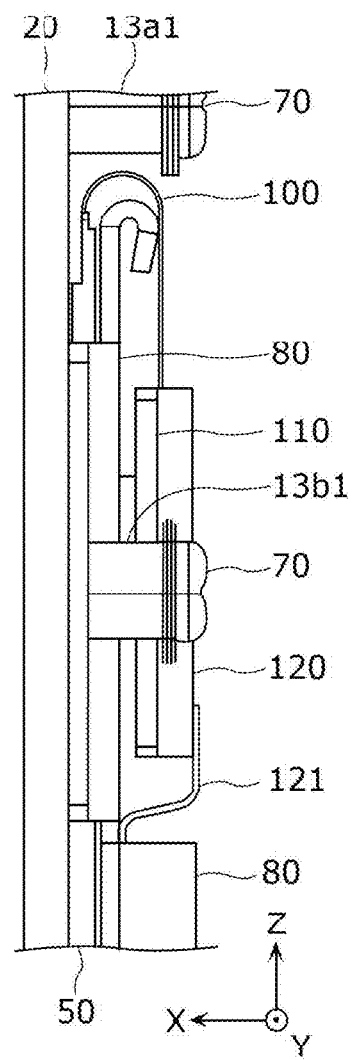
FIG. 8B is a diagram depicting a configuration of the display device according to the embodiment as viewed from the side with a peripheral edge fixing member removed from the display device.
Figure 8C:
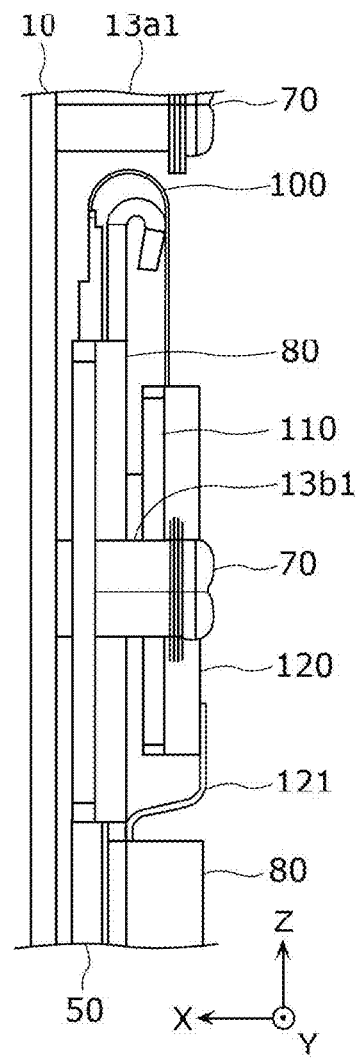
FIG. 8C is a diagram depicting a configuration of the display device according to the embodiment as viewed from the side with the peripheral edge fixing member and a plate-shaped member removed from the display device.

Here, a configuration of the display device 1 as viewed from a side (Y-axis direction) will be described with reference to FIGS. 8A to 8C. FIGS. 8A to 8C are diagrams of the display device 1 as viewed from the direction of an arrow depicted in FIG. 7. FIG. 8A is a diagram depicting a configuration of the display device 1 according to the present embodiment as viewed from the side. FIG. 8B is a diagram depicting a configuration of the display device 1 according to the present embodiment as viewed from the side with the peripheral edge fixing member 60 removed from the display device 1. FIG. 8C is a diagram depicting a configuration of the display device 1 according to the present embodiment as viewed from the side with the peripheral edge fixing member 60 and the plate-shaped member 20 removed from the display device 1. Incidentally, FIGS. 8A to 8C do not depict members such as the bonding member 40.

As depicted in FIG. 8A, the plate-shaped member 20 and the peripheral edge fixing member 60 are fixed by the screws 70 in such a manner as to be in contact with each other. Specifically, the second principal surface 20b of the plate-shaped member 20 and the surface on the first principal surface 20a side (X-axis positive side) of the plate-shaped portion 61 abut against each other.

As depicted in FIG. 8B, the display device 1 may include FPC 100, a printed board 110, and a heat radiating member 120.

The FPC 100 is a flexible board that connects the display panel 50 and the printed board 110 to each other. The FPC 100 is disposed on a back side of the display panel 50 in such a manner as to be bent. The floating effect of the display device 1 can be further enhanced by hiding the FPC 100 for supplying a video signal, for example, on the back side of the display device 1.

The printed board 110 is a board mounted with various kinds of electronic parts for displaying an image on the display panel 50.

The heat radiating member 120 is a plate-shaped member for radiating heat generated by the printed board 110. The heat radiating member 120 is, for example, provided such that at least a part of the heat radiating member 120 is in contact with the printed board 110. Further, the heat radiating member 120 is, for example, thermally connected to the heat radiating member 80. The heat radiating member 120 and the heat radiating member 80 are, for example, connected to each other by a transmitting member 121 that transmits heat. In addition, the heat radiating member 80 may, for example, partly abut against the plate-shaped member 20, and be fixed by the screws 70. Incidentally, in FIG. 8B and FIG. 8C, the transmitting member 121 is depicted to be thick as compared with FIG. 8A.

It is to be noted that, while only the second boss portions 13b1 among the first boss portions 13a1 and the second boss portions 13b1 are used to fix the heat radiating member 80, there is no limitation to this.

As depicted in FIG. 8C, the frame member 10 and the holding member 90 are fixed to each other with a part of the plate-shaped member 20 interposed therebetween by the screws 70 being screwed into the first boss portions 13a1 and the second boss portions 13b1 projecting from the frame member 10 (specifically, the boss member 13) to the X-axis negative side.

2. Simulation Result

Figure 9:
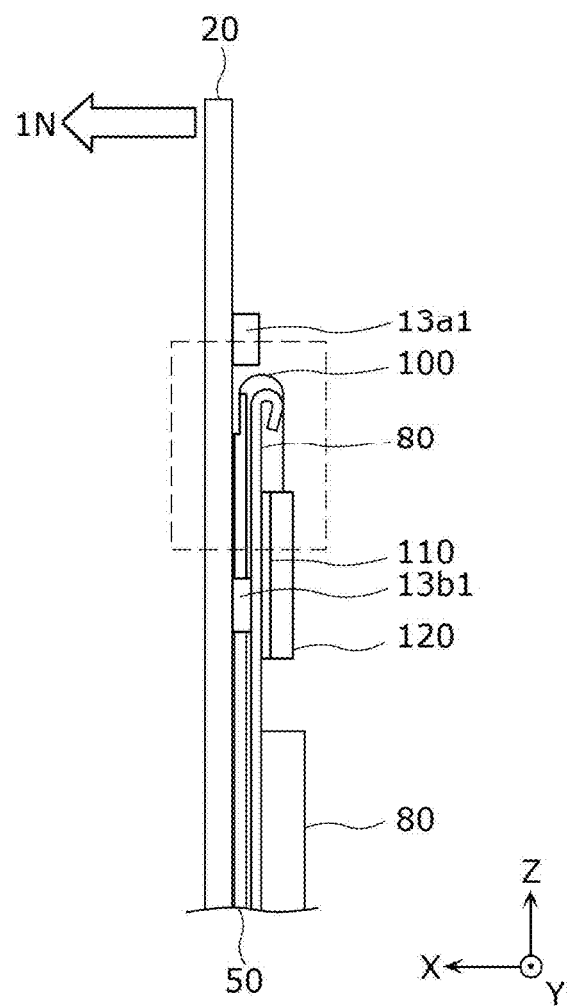
FIG. 9 is a first diagram of assistance in explaining a load applied in simulation to the display device according to the embodiment.

Results of simulation of stress applied to the display device 1 configured as described above will next be described with reference to FIGS. 9 to 14. In FIGS. 9 to 14, the configuration of the display device 1 used for simulation is schematically depicted, and a part of the members are not depicted or changed in shape. FIG. 9 is a first diagram of assistance in explaining a load applied in simulation to the display device 1 according to the present embodiment. FIG.

Figure 11A:
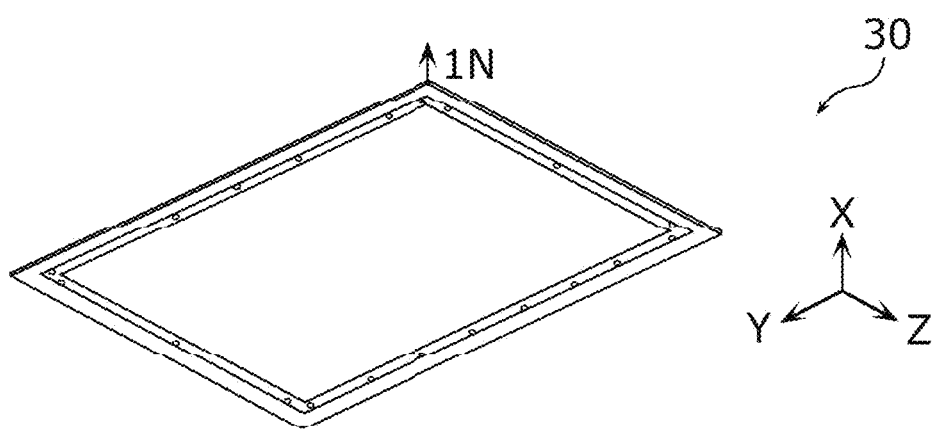
FIG. 11A is a second diagram of assistance in explaining a load applied in simulation to the display device according to the embodiment.

10 is a diagram of assistance in explaining a load applied in simulation to a display device according to a comparative example. FIG. 11A is a second diagram of assistance in explaining a load applied in simulation to the display device 1 according to the present embodiment.

As depicted in FIG. 9, the display device 1 according to the present embodiment has a configuration (configuration described in the above description) in which the first boss portions 13a1 and the second boss portions 13b1 are provided and the frame member 10 and the holding member 90 (specifically, the peripheral edge fixing member 60) are fixed to the plate-shaped member 20 by the screws 70. That is, the display device 1 according to the present embodiment has a configuration in which the frame member 10 and the holding member 90 reinforce the plate-shaped member 20.

Figure 10:
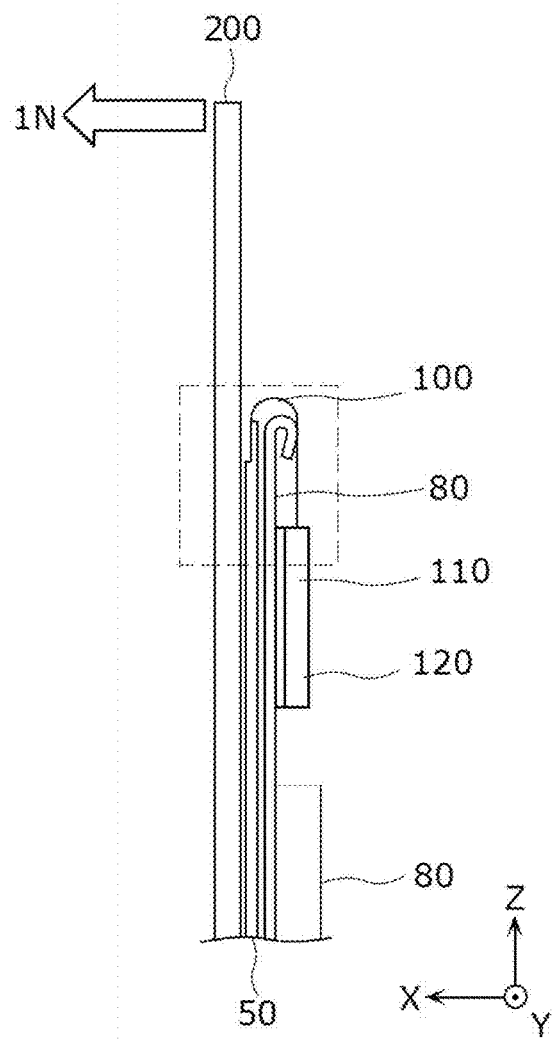
FIG. 10 is a diagram of assistance in explaining a load applied in simulation to a display device according to a comparative example.

As depicted in FIG. 10, the display device according to the comparative example has a configuration in which the first boss portions 13a1 and the second boss portions 13b1 are not provided and the frame member 10 and the holding member 90 (specifically, the peripheral edge fixing member 60) are not fixed to the plate-shaped member 20 by the screws 70. That is, in the display device according to the comparative example, the plate-shaped member 20 is not reinforced.

The simulation results illustrated in the following indicate effects depending on whether or not the frame member 10 and the holding member 90 are fixed to the plate-shaped member 20 by the screws 70.

Incidentally, the display device 1 according to the present embodiment and the display device according to the comparative example have a same configuration in parts except whether or not the frame member 10 and the holding member 90 are fixed to the plate-shaped member 20 by use of the screws 70. For example, the rigidity of the plate-shaped member 20 and the display panel 50 and other configurations in the display device 1 according to the present embodiment and the display device according to the comparative example are the same.

As depicted in FIG. 9 and FIG. 10, a load of 1 N (newton) is applied to end portions (end portions on the Y-axis and the Z-axis positive sides) of two such display devices in the direction of an arrow (direction from the X-axis negative side to the X-axis positive side). Specifically, a load of 1 N is applied to each of an end portion of the plate-shaped member 20 of the display device 1 according to the present embodiment and an end portion of a plate-shaped member 200 of the display device according to the comparative example. The end portions are a part within the peripheral edge portion 23 as viewed in plan. Incidentally, the plate-shaped members 20 and 200 are, for example, identical members.

Incidentally, while FIG. 11A is a perspective view depicting a load applied to the display device 1, a similar load is added also to the display device according to the comparative example.

Figure 11B:
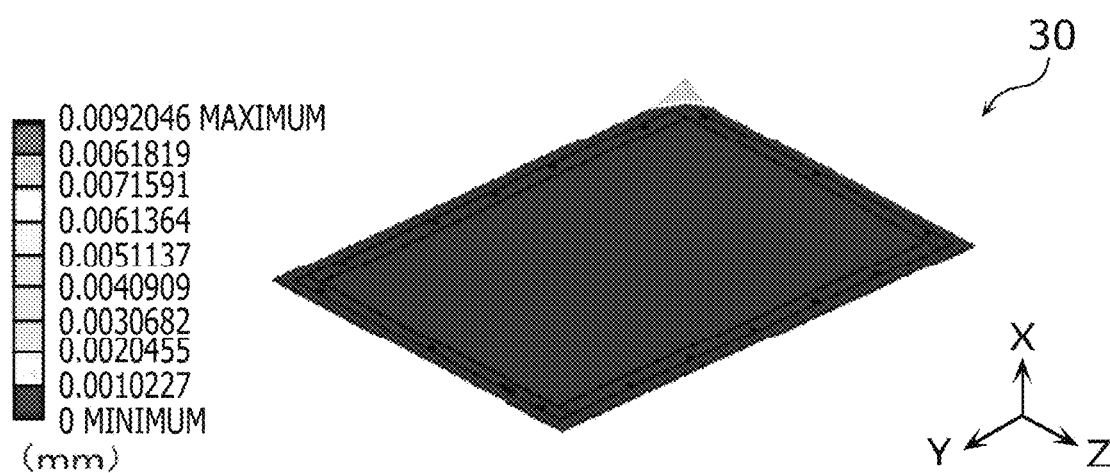
FIG. 11B is a diagram depicting a result of simulation of a shape deformation amount in the display device according to the embodiment in response to a load of 1 N.
Figure 11C:
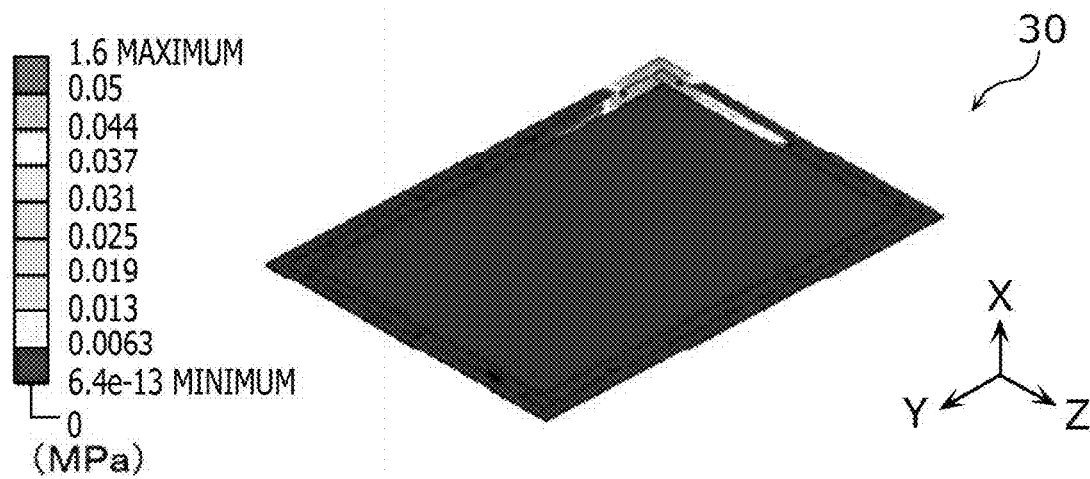
FIG. 11C is a first diagram depicting a result of simulation of stress applied to the display device according to the embodiment in response to a load of 1 N.
Figure 11D:
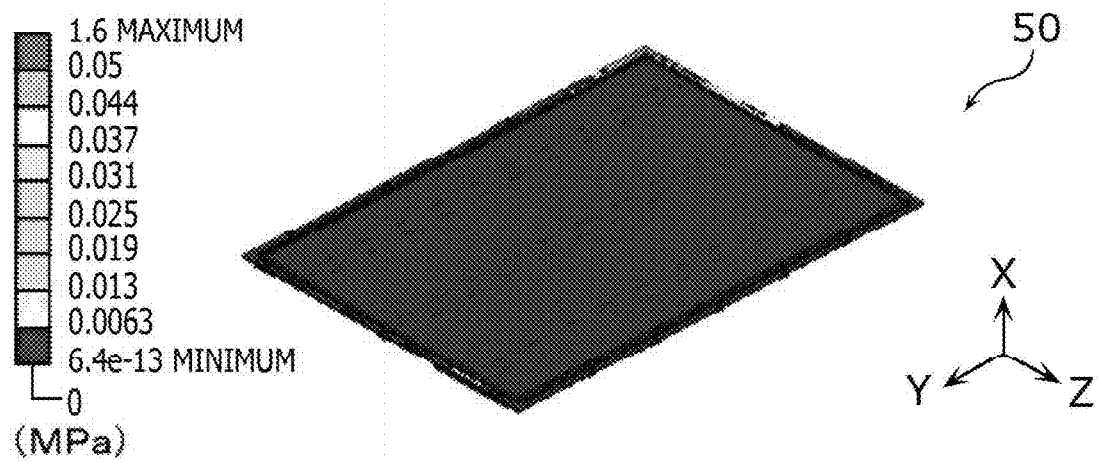
FIG. 11D is a diagram depicting a result of simulation of stress applied to a display panel of the display device according to the embodiment in response to a load of 1 N.

A result of simulation in the display device 1 according to the present embodiment will first be described. FIG. 11B is a diagram depicting a result of simulation of a shape deformation amount in the display device 1 according to the present embodiment in response to a load of 1 N. FIG. 11C is a first diagram depicting a result of simulation of stress applied to the display device 1 according to the present embodiment in response to a load of 1 N. FIG. 11D is a diagram depicting a result of simulation of stress applied to the display panel 50 of the display device 1 according to the present embodiment in response to a load of 1 N.

As depicted in FIG. 11B, the shape deformation amount in a case where a load of 1 N is applied is minute, with a maximum of 0.0092046 mm. Incidentally, the shape deformation amount represents an amount of deformation of the front panel 30 (specifically, the plate-shaped member 20) of the display device 1 according to the present embodiment to the X-axis positive side.

As depicted in FIG. 11C, the stress applied to the display device 1 in a case where a load of 1 N is applied is approximately 1.6 MPa at a maximum. Incidentally, FIG. 11C depicts the stress applied to the front panel 30 (specifically, the plate-shaped member 20) of the display device 1 according to the present embodiment.

As depicted in FIG. 11D, the stress applied to the display panel 50 in a case where a load of 1 N is applied is approximately 1.6 MPa at a maximum.

Figure 12A:
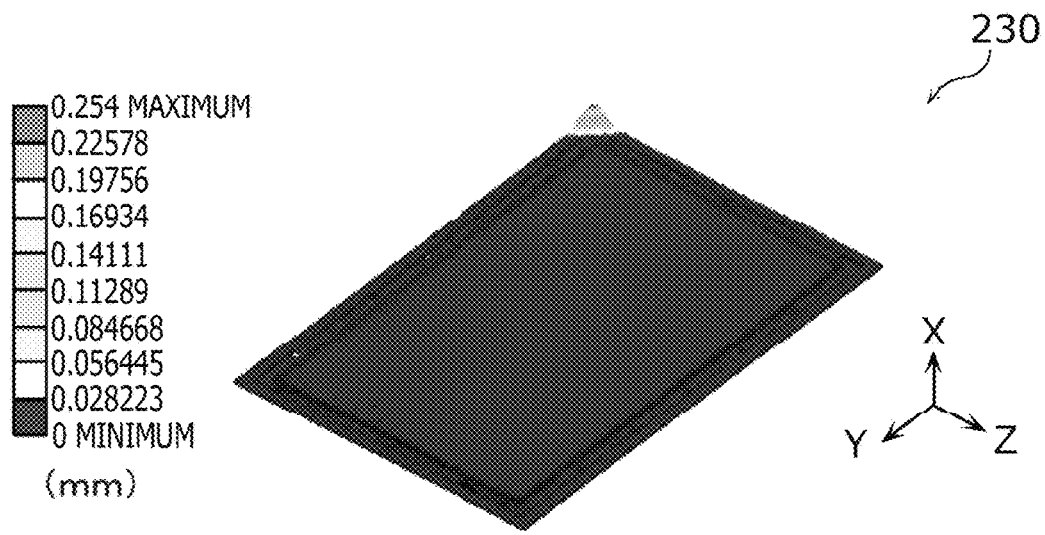
FIG. 12A is a diagram depicting a result of simulation of a shape deformation amount in the display device according to the comparative example in response to a load of 1 N.
Figure 12B:
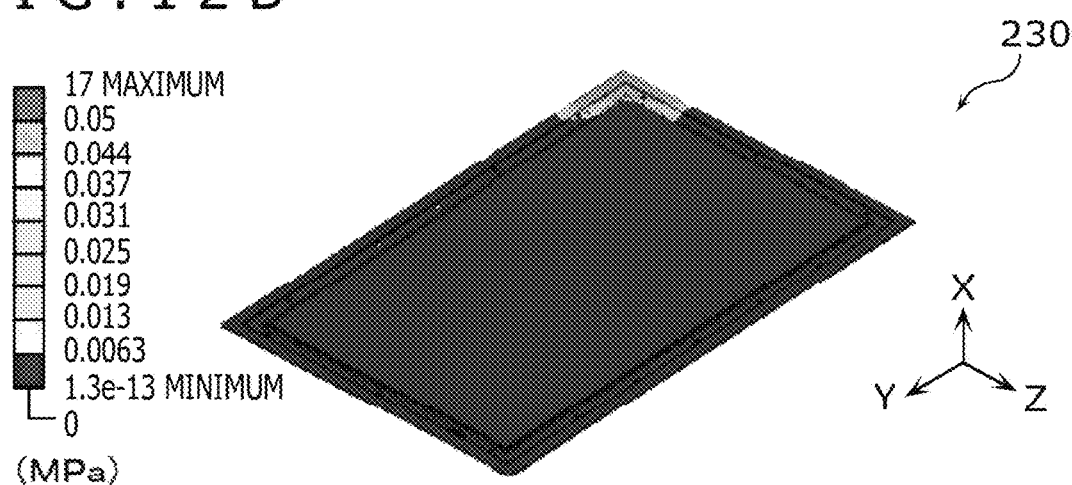
FIG. 12B is a first diagram depicting a result of simulation of stress applied to the display device according to the comparative example in response to a load of 1 N.
Figure 12C:
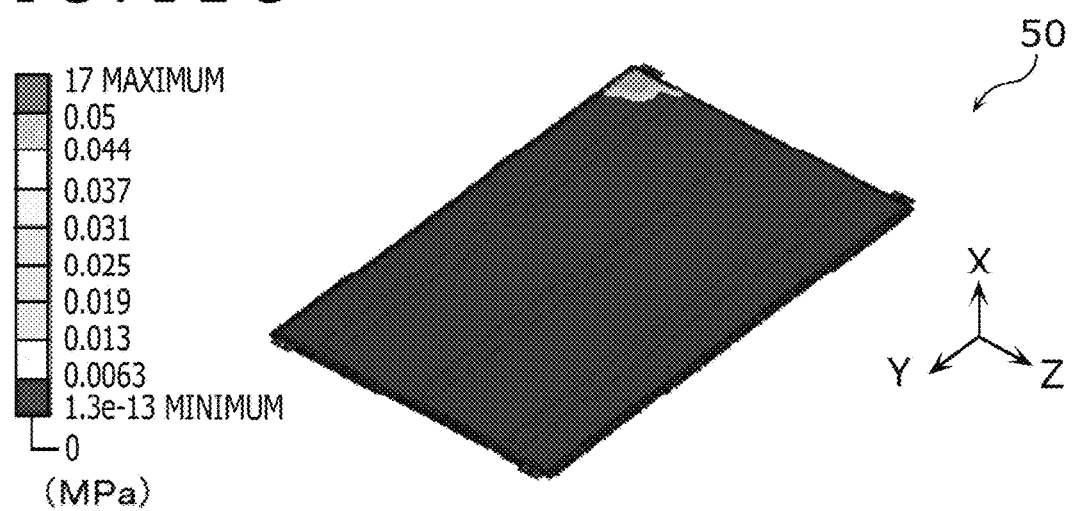
FIG. 12C is a diagram depicting a result of simulation of stress applied to a display panel of the display device according to the comparative example in response to a load of 1 N.

A result of simulation in the display device according to the comparative example will next be described with reference to FIGS. 12A to 12C. FIG. 12A is a diagram depicting a result of simulation of a shape deformation amount in the display device according to the comparative example in response to a load of 1 N. FIG. 12B is a first diagram depicting a result of simulation of stress applied to the display device according to the comparative example in response to a load of 1 N. FIG. 12C is a diagram depicting a result of simulation of stress applied to the display panel 50 of the display device according to the comparative example in response to a load of 1 N.

As depicted in FIG. 12A, the shape deformation amount in a case where a load of 1 N is applied is considerably large, with a maximum of 0.254 mm, as compared with the case of the display device 1. That is, the display device according to the comparative example is more easily deformed by a load. Consequently, in the display device according to the comparative example, the display panel 50 and a front panel 230 (specifically, the plate-shaped member 200) are easily peeled off from each other as compared with the display device 1 according to the embodiment. Incidentally, the shape deformation amount represents an amount of deformation of the front panel 230 of the display device according to the comparative example to the X-axis positive side.

As depicted in FIG. 12B, the stress applied to the display device 1 in a case where a load of 1 N is applied is as high as 17 MPa at a maximum, and is increased 10 times or more as compared with the case of the display device 1. Incidentally, FIG. 12B depicts the stress applied to the front panel 230 (specifically, the plate-shaped member 200) of the display device according to the comparative example.

As depicted in FIG. 12C, the stress applied to the display panel 50 in a case where a load of 1 N is applied is as high as 17 MPa at a maximum, and is increased 10 times or more as compared with the case of the display device 1.

Figure 13:
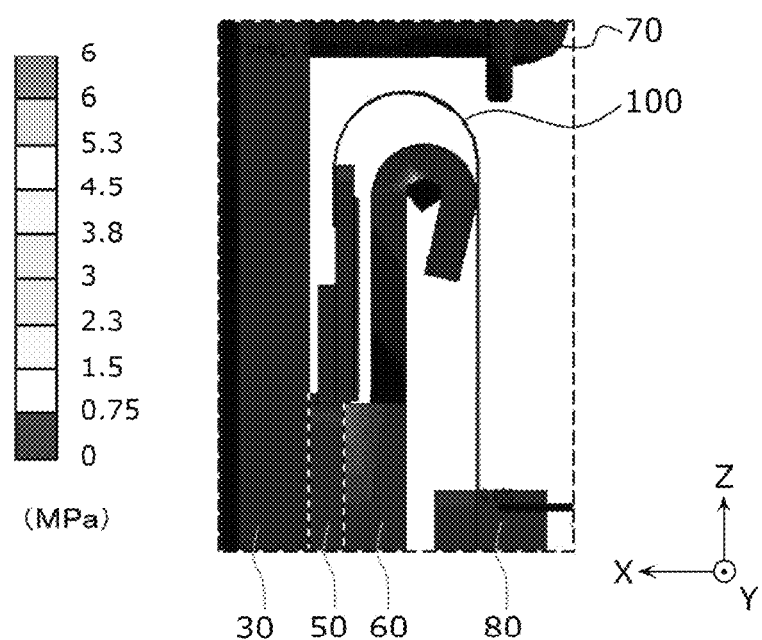
FIG. 13 is a second diagram depicting a result of simulation of stress applied to the display device according to the embodiment in response to a load of 1 N.
Figure 14:
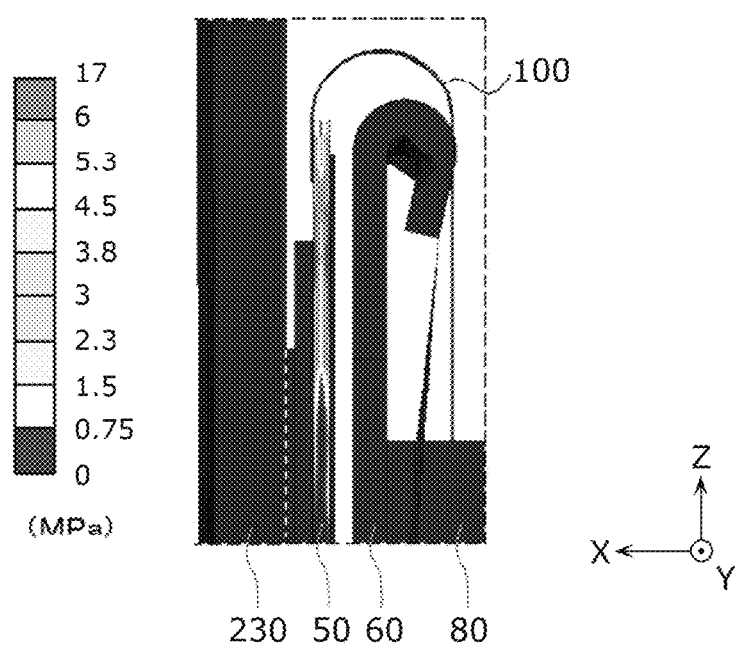
FIG. 14 is a second diagram depicting a result of simulation of stress applied to the display device according to the comparative example in response to a load of 1 N.

Results of simulation of stress applied to the display devices in a case where the display devices are viewed from a side will next be described with reference to FIG. 13 and FIG. 14. FIG. 13 is a second diagram depicting a result of simulation of stress applied to the display device 1 according to the present embodiment in response to a load of 1 N. FIG. 14 is a second diagram depicting a result of simulation of stress applied to the display device according to the comparative example in response to a load of 1 N.

As depicted in FIG. 13 and FIG. 14, it is indicated that stress exceeding 1.6 MPa is not applied to the display panel 50 of the display device 1 according to the present embodiment while stress exceeding 6 MPa (specifically, 17 MPa at a maximum) is applied to the display panel 50 of the display device according to the comparative example. This indicates that the display device 1 according to the present embodiment can reduce stress applied to the display panel 50. That is, the display device 1 according to the present embodiment can reduce stress applied to the display panel 50 when a load is applied to the plate-shaped member 20. In the display device 1, the frame member 10 and the holding member 90 are fixed to the plate-shaped member 20 by the screws 70, so that the display device 1 can reduce a deformation amount of the plate-shaped member 20 in a case where a load is applied, and can therefore reduce also stress applied to the display panel 50.

Hence, the display device 1 according to the present embodiment can suppress the deformation amount of the plate-shaped member 20, and consequently suppress stress applied to the display panel 50. That is, the display device 1 can suppress the occurrence of a display defect such as peeling-off of the plate-shaped member 20 and the display panel 50 from each other due to stress.

3. Effects and Others

As described above, the display device 1 according to one aspect of the present disclosure includes the display panel 50 having the display portion configured to display an image, the plate-shaped member 20 having the first principal surface 20a and the second principal surface 20b, the display panel 50 being disposed on the second principal surface 20b side, the plate-shaped member 20 including the screen portion 21 disposed in a position corresponding to the display portion, the opaque frame member 10 disposed at the peripheral edge of the screen portion 21, the bonding member 40 that has transparency and is configured to bond the display panel 50 and the plate-shaped member 20 to each other, the holding member 90 disposed on the second principal surface 20b side of the plate-shaped member 20, and a fixing member (for example, the plurality of screws 70) configured to fix the frame member 10 and the holding member 90 to the plate-shaped member 20. Then, the plate-shaped member 20 further includes the transparent peripheral edge portion 23 disposed on the outside of the frame member 10.

Consequently, because the display device 1 includes the transparent peripheral edge portion 23 on the periphery of the display panel 50, a floating effect can be produced such that the image displayed on the display panel 50 appears to be floating in the air, and because the frame member 10 and the holding member 90 are not fixed to each other by a bezel portion, for example, on the periphery of the peripheral edge portion 23, the floating effect is not impaired in fixing the frame member 10 and the holding member 90. In addition, because the frame member 10 and the holding member 90 are fixed to the plate-shaped member 20, deformation of the plate-shaped member 20 can be suppressed when a load is applied to a peripheral portion of the display device 1. Hence, it is possible to realize, as a display device providing the floating effect, the display device 1 that can suppress the occurrence of a display defect without impairing the floating effect.

In addition, the plate-shaped member 20 has the frame-shaped groove 22 formed between the screen portion 21 and the peripheral edge portion 23 as viewed from a front of the display device 1, and the frame member 10 is housed in the groove 22.

Thus, the display device 1 can reduce a sense of incongruity of boundaries between the frame member 10 and the screen portion 21 and between the frame member 10 and the peripheral edge portion 23, so that a floating sense can be enhanced. That is, the floating effect can be enhanced.

In addition, a surface on the first principal surface 20a side of the frame member 10 is flush with the first principal surface 20a in a state in which the frame member 10 is housed in the groove 22.

Thus, the surface on the first principal surface 20a side (surface on the X-axis positive side) of the frame member 10 and the first principal surface 20a are flush with each other. Consequently, a sense of incongruity of the edge of the image is eliminated, and the floating sense can be enhanced more. That is, the floating effect can be enhanced more.

In addition, the fixing member includes the plurality of screws 70 (an example of a plurality of fastening members) configured to fix the frame member 10 and the holding member 90 by fastening the frame member 10 and the holding member 90, and the frame member 10 includes the boss member 13 fixed by the plurality of screws 70 and the decorated member 11 disposed closer to the first principal surface 20a side than the boss member 13.

Thus, the frame member 10 and the holding member 90 can be fixed securely as compared with a case where a bonding member or another member is used. For example, it is possible to suppress unfixing of the frame member 10 and the holding member 90 even when a larger load is applied to the end portion of the plate-shaped member 20. Hence, the display device 1 can suppress the occurrence of a display defect more reliably.

In addition, a whole of the boss member 13 coincides with the decorated member 11 as viewed from a front of the display device 1.

Thus, the boss member 13 can be hidden by the decorated member 11. Consequently, the boss member 13 is not easily recognized by the user, so that the floating effect of the display device 1 can be further enhanced without impairment of decorativeness.

In addition, at least one of the frame member 10 and the holding member 90 has higher rigidity than that of the plate-shaped member 20.

Thus, deformation of the plate-shaped member 20 can be suppressed effectively by the at least one of the frame member 10 and the holding member 90 when a load is applied to a peripheral portion of the display device 1. Hence, the display device 1 can further suppress the occurrence of a display defect.

In addition, the plate-shaped member 20 is formed of a resin having transparency, and the at least one of the frame member 10 and the holding member 90 is formed of a metal.

Thus, at least one of the frame member 10 and the holding member 90 can easily have desired rigidity.

In addition, the plate-shaped member 20 includes a base material formed of polycarbonate and a hard coat layer formed on a front surface of the base material.

Thus, in a case where polycarbonate is used for the plate-shaped member 20, heat resistance performance of the display device 1 can be improved.

In addition, the holding member 90 includes the frame-shaped peripheral edge fixing member 60 (an example of a frame member) that at least partly coincides with the frame member 10 as viewed from a front of the display device 1.

Thus, the occurrence of a display defect in the display device 1 can be suppressed by using the frame member 10 and the frame-shaped peripheral edge fixing member 60. In addition, at least a part of the peripheral edge fixing member 60 can be hidden by the frame member 10. The peripheral edge fixing member 60 is therefore not easily recognized by the user, so that the floating effect of the display device 1 can be further enhanced.

In addition, the holding member 90 further includes the heat radiating member 80 configured to radiate heat generated by the display panel 50, and the peripheral edge fixing member 60 is disposed at a peripheral edge of the heat radiating member 80, and has higher rigidity than that of the heat radiating member 80.

Thus, the heat radiating member 80 is not easily recognized by the user. Consequently, the heat generated by the display panel 50 can be radiated while the floating effect of the display device 1 is further enhanced. In addition, even in a case where the heat radiating member 80 has low rigidity, the occurrence of a display defect can be suppressed by the peripheral edge fixing member 60. Such a holding member 90 can achieve both desired heat radiating performance and desired rigidity.

In addition, the holding member 90 is disposed in a position not coinciding with the peripheral edge portion 23 as viewed from a front of the display device 1.

Thus, the holding member 90 is not easily recognized by the user, so that the floating effect of the display device 1 can be further enhanced.

In addition, the screen portion 21 of the plate-shaped member 20 is transparent.

Thus, because the screen portion 21 is transparent, the image displayed on the display panel 50 can be viewed from the outside of the display device 1.

In addition, the display panel 50 is an organic EL display panel.

Thus, the use of an organic EL display panel excellent for black display as the display panel 50 can enhance the floating effect of the display device 1 particularly when an image with a black background is displayed.

Other Embodiments

The display device 1 according to one or a plurality of aspects has been described above on the basis of an embodiment. However, the present disclosure is not limited to this embodiment. Forms obtained by making various kinds of modifications occurring to those skilled in the art to the present embodiment and forms constructed by combining constituent elements in different embodiments may be included in the present disclosure unless deviated from the spirit of the present disclosure.

For example, in the foregoing embodiment, an organic EL display panel is used as the display panel 50. However, another flat display panel such as a liquid crystal display panel or a quantum dot light emitting diode (LED) display panel may be used as the display panel.

In addition, in the foregoing embodiment, the plate-shaped member 20 is formed by use of transparent polycarbonate. However, the plate-shaped member 20 may be formed by use of another transparent member. The plate-shaped member 20 may, for example, be formed by use of a transparent resin such as acrylic other than polycarbonate, or may be formed by use of glass, for example.

In addition, in the foregoing embodiment, the groove 22 is formed in the plate-shaped member 20. However, the groove 22 may not be formed. The frame member 10 may be fixed to the front surface of the plate-shaped member 20 in a flat plate shape.

In addition, it suffices for at least one of the frame member 10 (for example, the boss member 13) and the holding member 90 (for example, the peripheral edge fixing member 60) in the foregoing embodiment to have higher rigidity than that of the plate-shaped member 20. For example, at least one of the frame member 10 (for example, the boss member 13) and the holding member 90 (for example, the peripheral edge fixing member 60) in the foregoing embodiment may be formed of a metal. Thus, in the display device 1, for example, at least one of the boss member 13 and the peripheral edge fixing member 60 is configured to have higher rigidity than that of the plate-shaped member 20, that is, configured not to be easily deformed.

In addition, in the foregoing embodiment, description has been made of an example in which the frame member 10 is provided in such a manner as to be in contact with the bottom surface 22a of the plate-shaped member 20. However, another member may be provided between the frame member 10 and the bottom surface 22a.

In addition, in the foregoing embodiment, description has been made of an example in which the peripheral edge fixing member 60 is provided in such a manner as to be in contact with the second principal surface 20b of the plate-shaped member 20. However, another member may be provided between the peripheral edge fixing member 60 and the second principal surface 20b.

In addition, in the foregoing embodiment, the peripheral edge fixing member 60 is formed by use of a metal. However, the peripheral edge fixing member 60 may be formed by use of another material having higher rigidity than that of the plate-shaped member 20. The peripheral edge fixing member 60 may, for example, be formed by use of a resin material having higher rigidity than that of polycarbonate. In this case, the peripheral edge fixing member 60 may be formed of a transparent resin, or may be formed of an opaque resin.

In addition, the peripheral edge fixing member 60 in the foregoing embodiment may not include at least one of the first thick portions 62 and the second thick portion 63. For example, the peripheral edge fixing member 60 may have a uniform thickness.

In addition, in the foregoing embodiment, description has been made of an example in which the peripheral edge fixing member 60 and the heat radiating member 80 are separate members. However, without being limited to this, the peripheral edge fixing member 60 and the heat radiating member 80 may be members formed integrally with each other. In this case, the peripheral edge fixing member 60 and the heat radiating member 80 are formed of a same metal.

The present disclosure is useable as a display device providing a floating effect, particularly, a wall-mounted display device.

What is claimed is:

1. A display device comprising:
   a display panel having a display portion configured to display an image;
   a plate-shaped member having a first principal surface and a second principal surface, the display panel being disposed on a second principal surface side, the plate-shaped member including a screen portion disposed in a position corresponding to the display portion;
   an opaque frame member disposed at a peripheral edge of the screen portion;
   a bonding member that has transparency and is configured to bond the display panel and the plate-shaped member to each other;
   a holding member disposed on the second principal surface side of the plate-shaped member; and
   a fixing member configured to fix the frame member and the holding member to the plate-shaped member;

the plate-shaped member further including a transparent peripheral edge portion disposed on an outside of the frame member.

2. The display device according to claim 1, wherein
the plate-shaped member has a frame-shaped groove formed between the screen portion and the peripheral edge portion as viewed from a front of the display device, and
the frame member is housed in the groove.

3. The display device according to claim 2, wherein
a surface on a first principal surface side of the frame member is flush with the first principal surface in a state in which the frame member is housed in the groove.

4. The display device according to claim 1, wherein
the fixing member includes a plurality of fastening members configured to fix the frame member and the holding member by fastening the frame member and the holding member, and
the frame member includes a boss member fixed by the plurality of fastening members and a decorated member disposed closer to a first principal surface side than the boss member.

5. The display device according to claim 4, wherein
a whole of the boss member coincides with the decorated member as viewed from a front of the display device.

6. The display device according to claim 1, wherein
at least one of the frame member and the holding member has higher rigidity than that of the plate-shaped member.

7. The display device according to claim 6, wherein
the plate-shaped member is formed of a resin having transparency, and
the at least one of the frame member and the holding member is formed of a metal.

8. The display device according to claim 1, wherein
the plate-shaped member includes a base material formed of polycarbonate and a hard coat layer formed on a front surface of the base material.

9. The display device according to claim 1, wherein
the holding member includes a frame-shaped frame member that at least partly coincides with the frame member as viewed from a front of the display device.

10. The display device according to claim 9, wherein
the holding member further includes a heat radiating member configured to radiate heat generated by the display panel, and
the frame member is disposed at a peripheral edge of the heat radiating member, and has higher rigidity than that of the heat radiating member.

11. The display device according to claim 1, wherein
the holding member is disposed in a position not coinciding with the peripheral edge portion as viewed from a front of the display device.

12. The display device according to claim 1, wherein
the screen portion of the plate-shaped member is transparent.

13. The display device according to claim 1, wherein
the display panel is an organic electro-luminescence display panel.

* * * * *